United States Patent [19]

Obstfelder et al.

[11] Patent Number: 4,632,845
[45] Date of Patent: Dec. 30, 1986

[54] PROCESS FOR THE FABRICATION OF THERMAL PRINTING BOARDS IN MULTILAYER THICK-FILM TECHNOLOGY

[75] Inventors: Günther Obstfelder, Weinheim-lützelsachsen; Gerhard Kreutze, Neckarsteinach; Winfried Lüttig, Heiligkreuzsteinach, all of Fed. Rep. of Germany

[73] Assignee: F+O Electronic Systems GmbH & Co., Fed. Rep. of Germany

[21] Appl. No.: 550,176

[22] Filed: Nov. 9, 1983

[30] Foreign Application Priority Data

Nov. 9, 1982 [DE] Fed. Rep. of Germany ....... 3241225

[51] Int. Cl.$^4$ .............................................. B05D 5/12
[52] U.S. Cl. ....................... 427/96; 427/101; 427/102; 427/103; 427/126.2; 427/383.5; 427/419.3
[58] Field of Search .............. 427/96, 101, 102, 126.2, 427/383.5, 419.3, 103; 346/76 PH; 219/216 PH, 543

[56] References Cited

U.S. PATENT DOCUMENTS 4,138,605  2/1979  Stapleton et al. ................... 219/216
4,401,881  8/1983  Saito ................................... 219/216

*Primary Examiner*—Richard Bueker
*Attorney, Agent, or Firm*—Staas & Halsey

[57] ABSTRACT

A process for fabricating electronic switching elements and/or circuits in multilayer thick-film technology on a substrate. The electronic switching elements and/or circuits are printed onto the substrate in the form of liquid or pasty mixtures of materials, then heat-treated, whereupon at least one insulating layer is deposited on the thick-film conducting layer. In this process, the surface of any desired insulating interlayer is finished abrasively and subsequently again at least one thick-film conducting layer or at least one insulating layer is deposited on the finished surface. Then, the surface or this insulating layer is again finished abrasively in subsequent printing operations of thick-film conducting layers or in other insulating layers in order to provide upon completion each layer at least the same processing ingredients and conditions as those on the surface of the substrate.

16 Claims, 1 Drawing Figure

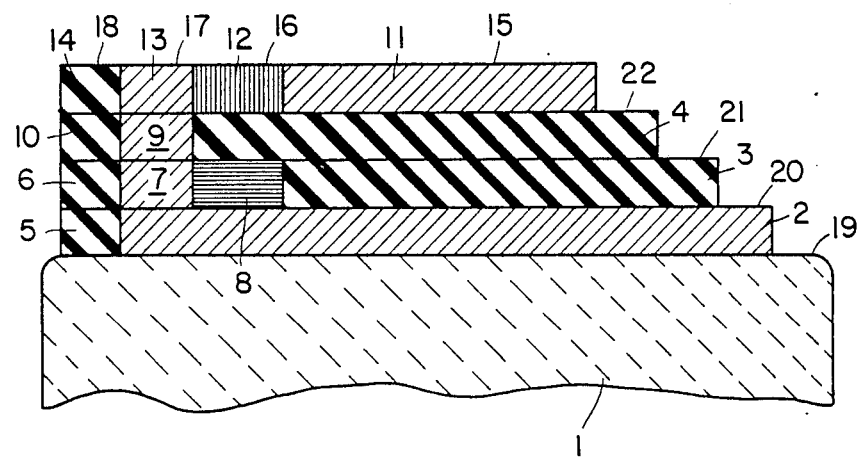

PROCESS FOR THE FABRICATION OF THERMAL PRINTING BOARDS IN MULTILAYER THICK-FILM TECHNOLOGY

BACKGROUND OF THE INVENTION

The invention relates to a process for the fabrication of electronic circuit elements and/or circuits in multilayer thick-film technology on a substrate, more particularly aluminum oxide or porcelain. The electronic circuit elements and/or circuits are printed onto the substrate in the form of liquid or pasty mixtures of materials, then heat-treated (to form a thick-film conducting layer) and, subsequently, at least one insulating layer is deposited on the thick-film conductor layer. The invention also relates to thusly produced electronic circuit elements and/or circuits in thick-film technology with a high degree of tolerance compliance.

To produce electronic circuit elements and/or circuits in thick-film technology, it is common practice to deposit thick-film conducting layer on a substrate consisting in particular of aluminum oxide or porcelain, a thick-film conducting layer by means of a screen or masking and template in the form of liquid or pasty mixtures of materials. The substrate is then subjected to a heat treatment, whereby the liquid or pasty mixtures of materials of the thick-film layer sinter out and the electrically conducting substrates contained in powder form therein are fixed on the substrate in the desired configuration. One or more insulating layers can be deposited on the thick-film conducting layer thus produced.

The following publication has been cited as relevant prior art: D. J. Holmes and R. G. Loasby: Handbook of Thick-Film Technology, Electrochemical Publicationi Ltd., Ayr, Scotland, 1976, Bell and Bain Ltd., Glasgow 1976.

It is likewise common practice to produce thermoboards in this fashion for printing presses, whereby an electrically conducting resistive layer is deposited using thick-film technology directly on the substrate and, again, an insulating layer is deposited thereon.

It is common practice, e.g., when making thermoboards, to trim the individual resistors of the resistive layer until each individual resistor attains the desired resistive value in a defined tolerance range. To date, it has merely been possible to trim the individual resistor in terms of its volume merely by changing the surface configuration, which results in a number of disadvantages. By changing the printing surface of the individual resistor, the whole printing pattern changes for the worse. Furthermore, this kind of trimming is not very accurate and requires relatively wide resistive tolerance ranges. Sand blasting as an abrasive technique for the surface is only possible for large surfaces. It cannot be used in a meaningful way to produce this type of resistors. In addition, in this case the corners are broken, with the result that the individual type face of the resistance spot becomes less sharp.

Another drawback of the processes of the prior art exists for the production of these thick-film circuit elements and/or circuits. It is not possible to print by fine-line technique and with a high degree of tolerance compliance in different planes above the substrate, i.e., again to deposite a thick-film conducting layer on an insulation layer that has been deposited. To date, only approximate results have been achieved, e.g., the placing of conductor tracks in different planes insulated from one another by insulating layers. It is not possible, however, to print any desired component, e.g., an IC or a resistor, in any desired plane above the substrate.

Likewise, if hybride circuits are designed as, thermal printing boards the necessity of depositing the resistor layer directly on the substrate is also a disadvantage, because most of the heat generated in the resistors is dissipated to the substrate and, hence, is no longer available for its actual task, i.e., the printing of the paper. Therefore, thermoboards of prior construction require considerable power in order to produce a satisfactory printing pattern. Likewise, the layer of resistors must be coated with an insulating layer, preferably a glass layer, to prevent the resistor layer from being scuffed prematurely when the paper enters the press. However, this deteriorates the layer of resistors still further and, on account of the insulating layer, again considerable power is required for printing the paper. As a result, a greater contact pressure is needed at the interface of the thermal printing boards and the paper to be printed.

SUMMARY OF THE INVENTION

Therefore, the primary object of the invention is to overcome the above is advantages when fabricating electronic circuit elements and/or circuits in multilayer thick-film technology. More particularly, this manufacturing method is to be improved in such a way that, again, a thick-film conducting layer can be printed in all planes onto subsequent insulating layers with a high degree of tolerance compliance. In any desired plane it should be possible to deposit any kind of component, thus enabling fine-line printing in a required pattern and with a high degree of tolerance compliance in all planes.

According to the invention, this object is achieved by providing a method for the fabrication of a thermal printing board with electronic circuit elements or circuits in multilayer thick-film technology on a substrate, wherein at least one thick-film conducting layer is printed onto the substrate in the form of liquid or pasty mixture of materials and then heat-treated, the method comprising the steps of depositing a first insulation layer on the first thick-film conducting layer; abrasively finishing the surface of the first insulation layer to provide at least the same surface conditions thereon as on the surface of the substrate; forming successively further insulation or conducting layers on the first insulating layer; after each formation of the successive layers, abrasively finishing the surface of the formed layer to provide at least the same surface conditions as on the surface of the substrate; and depositing a thick-film resistive layer on the uppermost abrasively-finished insulating layer.

Compared to the methods of the prior art, the process taught by the invention has the advantage that it can be employed for printing, in fine-line technology, other thick-film conducting layers onto the most diverse insulating layers above the substrate. Thus, advantageously, any desired insulating layer can again serve as a starting layer for a thick-film conducting layer to be printed thereonto. According to the teachings of the invention, the insulating layers as well as the thick-film conducting layers are fabricated with a high degree of tolerance compliance referred, for example, to the surface of the substrate. Therefore, by making use of the process of the invention it is possible, to print in a required pattern an electronic circuit or electronic component onto a second or third or any desired insulating layer and to connect and contact them during the fabrication process with thick-films located therebelow. This enables the manufacture of any hybride circuit which, can have a high concentration of electronic components or electronic circuits. The crucial point is that, according to the invention, any desired insulating layer can be finished in such a fashion that in terms of the technological data, such as surface waviness, surface roughness, tolerance compliance, and plane-parallelism, it possesses the same, or even surpasses, the original properties of the substrate. Therefore, for this reason alone it is possible to print in a repeatable fashion onto an insulating layer. If any insulating layer has the original tolerance compliance properties of the substrate, then it is obvious that the impression made thereon is of the same quality as that made directly on the substrate.

According to the invention, the insulating layers and, where applicable, also the thick-film conducting layer in the last ply are finished abrasively with maximum tolerance compliance and accuracy, so that the properties of the substrate or of its surface, e.g., plane-parallelism, surface roughness, surface waviness and spacing dimensions are achieved and even surpassed on the finished surface of the insulating layer.

Furthermore, the process of the invention is eminently suitable for the production of thermal printing board for printing presses. On the basis of the invention, the treatment of any desired insulating layer above the substrate surface can be accomplished in such a fashion that this surface of the insulating layer can be used as a starting surface for the printing operation. Therefore, it is possible to place the layer of resistors not on the substrate, but on different insulating layers disposed therebetween, whereby the layer of resistors can be placed on the insulating layers as the uppermost last layer. In this case, the insulating layer lies exactly at the site where it is used technologically, namely, directly on the paper. This has the advantage that poor heat conductors can be employed as insulating layers, so that only a very small amount of the heat supplied to the resistor is transferred by the latter to the insulating layers located underneath the resistive layer instead and as desired, the heat moves upwards to the top of the paper to be printed.

By way of example, if the hybrid switching element is a thermopressure board, then, due to the abrasive finishing and the resultant minimal waviness of the printing surface of the resistors, the resistor is brought exactly into plane-parallel contact with the impression means, e.g., an impression roller. Thus, the layer of resistors is not scuffed unevenly, resulting in a conformal printing pattern.

Due to the abrasive finishing and achieving a defined tolerance compliance, the layer of resistors can be made much thinner than those in thermal printing boards of the prior art. This leads to a considerable reduction of the thermal inertia of the resistors, so that the resistors with less required power become faster than those of known construction. The process of the invention thus enables optimization of the thermal inertia.

When fabricating thermal printing boards, the process of the invention has the further advantage that it enables the resistor to be trimmed by volume without altering the surface geometry. According to the invention, the thickness of the layer of resistors is altered, and is finished abrasively in a required pattern. In this way, the relatively complex techniques used presently for the trimming of the resistors, can be eliminated. These techniques change the surface geometry of the resistor, but not the thickness of the layer of resistors. Thus, well-defined resistor surfaces can again be fashioned as appropriate impression points to enable the production of an accurate printing pattern of the individual resistor.

Another advantage of the process taught by the invention for the manufacture of thermal printing boards is the fact that the layer of resistors can be abrasively machined without destroying or deleteriously affecting other thick-film layers disposed therebelow such as, conductor tracks. Therefore, all known trimming processes, such as sand blasting and laser cutting, which at present cannot be employed in thermal printing boards to produce the individual resistors, can be used. Practically all mechanical and chemical methods for the abrasive finishing of the layer of resistors can be used so that, advantageously, the geometric configuration of the electronic elements and/or circuits on the various insulation layers can be freely chosen. It is not possible to damage the conducting layers located below the thick-film conducting layer to be finished, since again one can place insulating layers of any desired thickness between two thick-film conducting layers, ruling out any deterioration of the conducting layers therebelow.

Therefore, by making use of the process of the invention, it is generally possible to design any hybride circuit in thick-film technology.

Now, when constructing thermal printing boards for printing presses, one or more layers can be placed underneath the layer of resistors, which reflects the heat radiated downwards by the resistor layer, so that the efficiency of the heat released by the resistor to the paper to be printed is further enhanced. The result is a further reduction of the power dissipation of the resistor.

In another embodiment of the invention, the resistors can be embedded in the insulating layer supporting them, the flat surface of the resistors and the flat surface of the insulating layer lying in the same plane. Advantageously, during the impression the layer of resistors is not scuffed at the edges, so that their edges will not be bevelled. This leads to a considerable lengthening of the life of the layer of resistors. Hence, another advantage is that the layer of resistors need not be protected with another insulating layer against mechanical effects. Since it is also possible to eliminate the insulating layer on the layer of resistors, the efficiency of the heat dissipation of the layer of resistors to the paper is further increased.

As a result of the process taught by the invention, it is now possible to design the resistors in the form of flat mesas with steps which can be overlapped by the insulating layer or kept free, so there is an air gap between the insulating layer and the cubic or right-parallelepipedal configuration of the resistor. This causes the heat that has been generated to be dissipated upwards to the paper and distributed completely uniformly within the resistor. As a result, pressure is exerted by the entire surface of the resistor, thereby also accelerating the printing operation with a thermal printing board as taught by the invention.

Therefore, as a rule, any desired hybrid circuit can be constructed by means of the the process of the invention, whereby any number of thick-film conducting layers can be placed above the substrate. According to the invention it is possible to reproduce, or even to improve, in any insulating layer above the substrate the technological conditions of the substrate and of its surface, such as plane-parallelism, geometry, surface waviness, surface roughness or thickness. Accordngly, the surface of the corresponding insulating layer thus finished can, in turn, be used as a starting surface for the deposition of another printed circuit. The original properties of the substrate or of its surface, which nowadays are at best suitable for the deposition of a printed circuit, are thus reproduced at will on an insulating layer.

This is only possible because of the high tolerance compliance with which the abrasive finishing of the insulating layer(s) and, thereby, the reproduction of the technological conditions is effected. The corresponding thick-film conducting layers as well as the insulating layers can be abraded by mechanical processes such as sawing, sand blasting, or laser cutting, or by chemical etching. Both the insulating layers and the thick-film conducting layers can be finished such that an absolute toleranced dimension of the layer thickness(s) referred, for example, to the surface of the substrate, can be maintained. This results advantageously in a free choice of the geometric configurations of the electronic elements and/or circuits on the various insulating layers which therefore can be printed onto the surface in fine-line technology.

When making use of the process of the invention for thermal printing board manufacture, the slightest contact pressure of the thermal printing board against the paper can be achieved with minimal heating, because the individual points of the resistor operate with minimum heat distribution. This results in a printing quality previously not achievable, and in an accelerated printing operation.

Since the layer of resistors is no longer placed directly on the surface of the substrate, it can be insulated from the surface of the substrate, so that a thermal printing board thus produced is practically no longer subjected to heat losses.

The process of the invention also permits an optimized circuit design.

Therefore, when fabricating electronic circuit elements in multilayer thick-film technology, the process taught by the invention allows for the first time the application of a process for the abrasive finishing of the surface of a layer on any desired interlayer, with the result that on the surface of this abrasively finished layer one finds at least the same initial values for the next printing operation that were provided for the first printing onto the substrate, the abrasive finishing not being restricted to insulating layers alone.

BRIEF DESCRIPTION OF THE DRAWINGS

The drawing is a sectional view illustrating the manufacture of a multi-layered thermal printing board according to the invention.

DETAILED DESCRIPTION OF A PREFERRED EMBODIMENT

A preferred embodiment of the invention illustrated in the drawing will now be described below:

A thick-film conducting layer 2 is deposited, preferably printed, onto a substrate preferably consisting of aluminum oxide or porcelain. The substrate with layer 2 is then heat-treated. Surface 19 of substrate 1 is finished in such a way that it is completely flat.

Surface 20 of the thick-film conducting layer 2 is now abrasively finished by mechanical or chemical means until the surface data concerning surface waviness, surface roughness and plane-parallelism correspond at least to the values of the finish of surface 19 of substrate 1. Then, another thick-film conducting layer 7 is deposited on this thick-film conducting layer 2 in order, for example, to extend the conductor path upwardly in the multi-layered structure. As is apparent from the drawing, the size of this thick-film conducting layer 7 can be minimized so as to enable the current to flow to the surface of the electronic circuit element. At the same time, an insulating layer 3 is deposited on surface 20 of thick-film conducting layer 2 which, therefore, lies in the same plane with thick-film conducting layer 7. Surface 21 of this insulating layer 3 is now abrasively finished by mechanical or chemical means until the surface properties correspond at least to those of surface 19 of substrate 1. It will be understood that at the same time the surface of thick-film conducting layer 7 will also be finished.

Another insulating layer 4 is now deposited on surface 21 of insulating layer 3 that has been finished abrasively in the manner proposed by the invention. Another thick-film conducting layer 9 is likewise deposited onto thick-film conducting layer 7, preferably using thick-film technology. This surface 22 of insulating layer 4 and also the surface of thick-film conducting layer 9—are again finished abrasively by mechanical or chemical means until the surface properties of surface 22 correspond at least to those of surface 19 of substrate 1.

Subsequently, another thick-film conducting layer 11 is deposited on this insulating layer 4, preferably in thick-film technology. At the same time, another thick-film conducting layer 13 is deposited on the surface of thick-film conducting layer 9 in order to provide a current path from the bottommost thick-film conducting layer 2 via thick-film conducting layers 7 and 9 to thick-film conducting layer 13 and thick-film conducting layer 11. The example depicted in the drawing shows a thermopressure printing board, so that the uppermost thick-film conducting layer is a layer of resistors or a single resistor. Therefore, another thick-film conducting layer 11 is now deposited on surface 22 of insulating layer 4 and which in this case serves for the derivation of current. Thus, a resistor 12 is contacted from two sides by means of thick-film conducting layers 11 and 13, thick-film conducting layer 13 representing the supply line and thick-film conducting layer 11 representing the leakage line for the electrical current flowing through resistor 12.

Surface 15 of thick-film conducting layer 11, surface 16 of resistor 12, and surface 17 of thick-film conducting layer 13 can be abraded mechanically or chemically until excellent surface properties are again obtained.

For purposes of insulation, the thick-film conducting layers 2, 7, 9 and 13 are provided on one side with insulating layers 5, 6, 10 and 14, so that these insulating layers extend upwardly to the uppermost surface of the thermal printing board.

Furthermore, in the embodiment shown, a layer 8 is deposited underneath the layer of resistors 12 to reflect heat radiated by the resistors 12. This layer 8 serves to again reflect upwards to the layer of resistors 12 the heat radiated downwards towards substrate 1 by the layer of resistors 12.

According to the process of the invention, practically any number of thick-film conducting layers alternating with insulating layers can be deposited on a substrate without reducing the accuracy of impression during the printing of the thick-film conducting layers. Therefore, when applying the process, to a thermopressure printing board it is possible, after the last sequence of operations, to cause all the individual resistors 12 to lie in one plane, whereby the surface of these resistors possesses at least the same surface properties as those of the surface of the substrate.

According to the process of the invention, a plurality of any desired electronic switching elements and/or circuits can be fabricated in multilayer thick-film technology.

Preferably, the surface of the individual layers can be abrasively machined by grinding, sawing, honing, lapping or milling. Likewise, the surface of the individual layers can be abraded and finished by laser means.

According to the invention, the accuracy of the material removal shall be such as to achieve a waviness of less than five microns ($5 \times 10^{-6}$ m). Preferably, the material is removed until a waviness is attained of $+1$ micron, the waviness being referred to an absolutely straight line along the substrate, preferably along the longitudinal axis of the substrate or of the circuit elements. When fabricating thermopressure printing boards with resistors that are placed in series, the waviness is referred to a straight line along the resistors so that preferably the uppermost surface of the resistors maintains a waviness of $+1$ micron.

We claim:

1. A method for the fabrication of a thermal printing board with electronic circuit elements or circuits in multilayer thick-film technology on a substrate, wherein at least one thick-film conducting layer is printed onto said substrate in the form of liquid or pastry mixture of materials and then heat-treated, the method comprising the steps of:
   (a) depositing a first insulation layer on said first thick-film conducting layer;
   (b) abrasively finishing the surface of said first insulation layer to provide at least the same surface conditions thereon as on the surface of said substrate;
   (c) forming successively further insulation and conducting layers such that a conducting pathway is provided between the first thick-film conducting layer and a thick-film resistive layer;
   (d) after each formation of said successive layers, abrasively finishing the surface of said formed layer to provide at least the same surface conditions as on the surface of said substrate; and
   (e) depositing a thick-film resistive layer on the uppermost abrasively-finished insulating layer.

2. The method of claim 1, wherein the surface of the formed layers finished to provide at least the same surface conditions as on the surface of said substrate includes the surface conditions in the substrate in the group of surface waviness, surface roughness, tolerance compliance and plane-parallelism.

3. The method of claim 1, wherein said surface of said insulating and thick-film conducting layers forming the last ply are finished abrasively to obtain a waviness of less than 5 microns ($5 \times 10^{-6}$ m) referred to a straight line along the longitudinal axis of said substrate or along the orientation of said circuit elements.

4. The method of claim 3, wherein the finish of said last ply has a surface waviness of $\pm 1$ micron.

5. The method of claim 3, wherein the surfaces of each formed layer are machined abrasively by grinding, sawing, honing, lapping or milling.

6. The method of claim 1, wherein a plurality of thick-film conducting layers and insulating layers are arranged with a high degree of tolerance compliance on said substrate and said thick-film resistive layer is deposited on the uppermost insulating layer and subdivided into a plurality of single resistors to form the thermal printing board.

7. The method of claim 2, wherein a plurality of thick-film conducting layers and insulating layers are arranged with a high degree of tolerance compliance on said substrate and said thick-film resistive layer deposited on the uppermost insulating layer subdivided into a plurality of single resistors to form the thermal printing board.

8. The method of claim 6, further comprising the step of forming a layer on said substrate or as an interlayer on a subsequent insulating layer or thick-film conducting layer underneath said thick-film resistive layer for reflecting the radiation of said thick-film resistive layer.

9. The method of claim 7, further comprising the step of forming a layer on said substrate or as an interlayer on a subsequent insulating layer or thick-film conducting layer underneath said thick-film resistive layer for reflecting the radiation of said thick-film resistive layer.

10. The method of claim 7, wherein said resistors on at least two opposed sides are embedded in said insulating layer, the flat surfaces of said resistors and of said insulating layer lying on the same plane.

11. The method of claim 8, wherein said resistors on at least two opposed sides are embedded in said insulating layer, the flat surfaces of said resistors and of said insulating layer lying on the same plane.

12. The method of claim 11, wherein said individual resistors are of the mesa type with steps, and said insulating layers overlap said steps of said individual resistors.

13. The method of claim 10, wherein an air gap is provided between said resistors and said insulating layer.

14. The method of claim 6, wherein said uppermost insulating layer is finished abrasively without altering the geometric configuration of the resistive layer and said resistive layer is trimmed by laser means.

15. The method of claim 7, wherein said uppermost insulating layer is finished abrasively without altering the geometric configuration of said individual resistors, and said resistive layer is trimmed by laser means.

16. The method of claim 10, wherein said uppermost insulating layer is finished abrasively without altering the geometric configuration of said individual resistors, and said resistive layer is trimmed by laser means.

* * * * *